(12) United States Patent
Petz et al.

(10) Patent No.: US 10,957,644 B2
(45) Date of Patent: Mar. 23, 2021

(54) INTEGRATED STRUCTURES WITH CONDUCTIVE REGIONS HAVING AT LEAST ONE ELEMENT FROM GROUP 2 OF THE PERIODIC TABLE

(71) Applicant: Micron Technology, Inc., Boise, ID (US)

(72) Inventors: Christopher W. Petz, Boise, ID (US); Everett A. McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 15/887,064

(22) Filed: Feb. 2, 2018

(65) Prior Publication Data
US 2019/0244908 A1 Aug. 8, 2019

(51) Int. Cl.
| | |
|---|---|
| *H01L 23/532* | (2006.01) |
| *H01L 21/768* | (2006.01) |
| *H01L 21/285* | (2006.01) |
| *H01L 23/528* | (2006.01) |
| *H01L 21/311* | (2006.01) |
| *H01L 21/3213* | (2006.01) |

(52) U.S. Cl.
CPC .... *H01L 23/53209* (2013.01); *H01L 21/2855* (2013.01); *H01L 21/31111* (2013.01); *H01L 21/32133* (2013.01); *H01L 21/76834* (2013.01); *H01L 21/76852* (2013.01); *H01L 23/528* (2013.01); *H01L 23/5329* (2013.01); *H01L 23/53204* (2013.01)

(58) Field of Classification Search
CPC ......... H01L 21/76829; H01L 21/76831; H01L 21/76832; H01L 21/76852; H01L 21/76849; H01L 21/76888; H01L 21/76834; H01L 21/31111; H01L 21/2855; H01L 21/32133; H01L 23/53209; H01L 23/528; H01L 23/5329
See application file for complete search history.

(56) References Cited

U.S. PATENT DOCUMENTS

| | | | | |
|---|---|---|---|---|
| 4,022,931 A | * | 5/1977 | Black | H01L 21/28512 438/597 |
| 4,165,515 A | * | 8/1979 | Bergman, Jr. | H01L 33/0004 257/30 |
| 2008/0284935 A1 | * | 11/2008 | Takahashi | G02F 1/136286 349/46 |
| 2011/0133190 A1 | * | 6/2011 | Mori | H01L 29/458 257/57 |
| 2014/0353834 A1 | * | 12/2014 | Hirose | H01L 23/3736 257/772 |
| 2015/0349082 A1 | * | 12/2015 | Zhu | H01L 21/02178 257/411 |

* cited by examiner

*Primary Examiner* — Sue A Purvis
*Assistant Examiner* — Scott Stowe
(74) *Attorney, Agent, or Firm* — Wells St, John P.S.

(57) ABSTRACT

Some embodiments include an integrated structure having a conductive region which contains one or more elements from Group 2 of the periodic table. Some embodiments include an integrated structure which has a conductive region over and directly against a base material. The conductive region includes one or more elements from Group 2 of the periodic table, and has a pair of opposing sidewalls along a cross-section. A capping material is over and directly against the conductive region. Protective material is along and directly against the sidewalls of the protective region.

22 Claims, 4 Drawing Sheets

INTEGRATED STRUCTURES WITH CONDUCTIVE REGIONS HAVING AT LEAST ONE ELEMENT FROM GROUP 2 OF THE PERIODIC TABLE

TECHNICAL FIELD

Integrated structures with conductive regions having at least one element from group 2 of the periodic table.

BACKGROUND

Conductive materials have numerous uses in integrated circuitry. For instance, the conductive materials may be incorporated into wiring, shielding, wordlines, digit lines, interconnects, etc. A continuing goal of integrated circuit fabrication is to increase integration density. A related goal is to decrease the dimension of conductive components, while maintaining suitable conductivity along the components. It would be desirable to develop new materials which are suitable for being utilized in conductive components, and which may have desired high conductivity (i.e., low resistivity) and acceptable melting temperature.

DETAILED DESCRIPTION OF THE ILLUSTRATED EMBODIMENTS

Some embodiments include methods of incorporating one or more elements from Group 2 of the periodic table (e.g., one or more of beryllium, magnesium, calcium, strontium and barium) into conductive regions of integrated structures. Example embodiments are described with reference to FIGS. 1-7.

Figure 1:
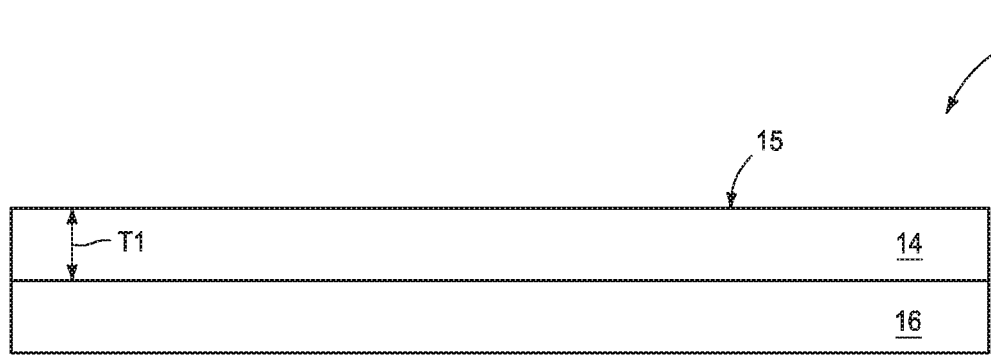
FIGS. 1-6 are diagrammatic cross-sectional views of a portion of an example construction at example process stages of an example method for fabricating example integrated structures.

Referring to FIG. 1, a construction 10 includes a base material 14 over a supporting material 16.

The base material 14 may comprise any suitable composition(s); and in some embodiments may include one or more of nitrogen, carbon and silicon. For instance, in some embodiments the base material may comprise, consist essentially of, or consist of one or more of titanium nitride, silicon nitride, silicon carbide, TiSiN, SiCN, etc., where the chemical formulas indicate primary constituents rather than specific stoichiometries. In some embodiments, the base material 14 may be electrically conductive (e.g., may comprise, consist essentially of, or consist of titanium nitride), and in other embodiments the base material 14 may be electrically insulative (e.g., may comprise, consist essentially of, or consist of silicon nitride).

The base material 14 has an upper surface 15.

In some embodiments, the base material 14 may have a thickness T1 within a range of from about 10 angstroms (Å) to about 2000 Å.

The supporting material 16 may comprise semiconductor material (e.g., monocrystalline silicon), and may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the supporting material 16 may correspond to a semiconductor substrate containing one or more materials associated with integrated circuit fabrication. Such materials may include, for example, one or more of refractory metal materials, barrier materials, diffusion materials, insulator materials, etc. For instance, if the base material 14 comprises conductive material, the supporting material 16 may comprise an insulative material (e.g., silicon dioxide, aluminum oxide, silicon nitride, etc.) over a semiconductor material.

Figure 2:
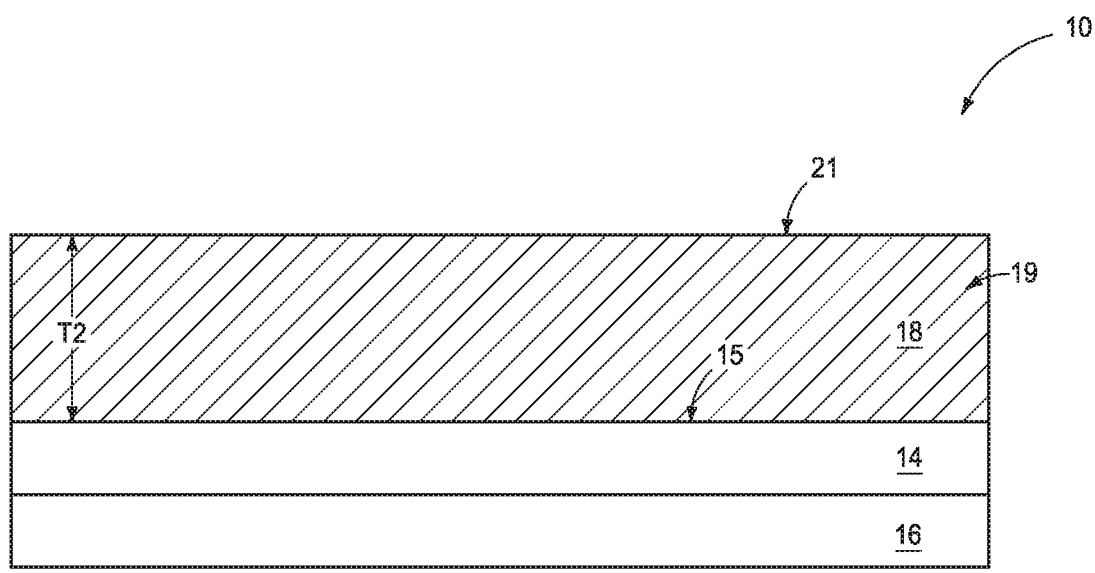

Referring to FIG. 2, conductive material 18 is formed over the base material 14. The conductive material 18 may comprise, consist essentially of, or consist of one or more elements from Group 2 of the periodic table. In some embodiments, the conductive material 18 may comprise, consist essentially of, or consist of one or more of beryllium, magnesium and strontium. In some embodiments, the conductive material 18 may comprise, consist essentially of, or consist of beryllium.

The conductive material 18 may be considered to be configured as a conductive region 19 which is directly against the upper surface 15 of the base material 14. In some embodiments, the base material 14 may be selected to be suitable for adhesion of the conductive region 19 thereto; and accordingly, the base material 14 may be referred to as an adhesion material. For instance, in some embodiments it is found that elements from Group 2 of the periodic table (e.g., magnesium, beryllium, strontium, etc.) of conductive region 19 adhere well to an adhesion material 14 which comprises one or more nitrides (e.g., titanium nitride, silicon nitride, etc.).

In some embodiments, the conductive region 19 may have a thickness T2 within a range of from about 50 Å to about 10,000 Å.

An advantage of utilizing a conductive region which comprises one or more materials from Group 2 of the periodic table is that such may have desired high conductivity suitable for utilization in highly-integrated conductive structures; and such may also have a melting point suitable for integrated circuit fabrication (e.g., may have a melting point high enough to enable the conductive region 19 to be formed at the so-called front-end-of-the-line during integrated circuit fabrication).

Tungsten is commonly utilized as a conductive material in conventional integrated structures. If the conductive region 19 comprises, consists essentially of, or consists of beryllium, instead of tungsten, such may offer a conductivity enhancement of at least about 40% relative to the tungsten.

The conductive region 19 may be formed utilizing any suitable processing. For instance, in some embodiments the conductive region 19 may be formed utilizing physical vapor deposition (e.g., DC magnetron sputtering). In some embodiments, the conductive region 19 may be formed in situ relative to the base material 14 (i.e., the base material 14 is formed, and then the conductive region 19 is formed over such base material without ever exposing the base material to air). In other embodiments, the base material 14 may be exposed to air prior to being placed in a physical vapor deposition (PVD) chamber (or other suitable chamber) where the conductive region 19 is deposited onto the base material 14.

The conductive material 18 has an upper surface 21.

Figure 3:
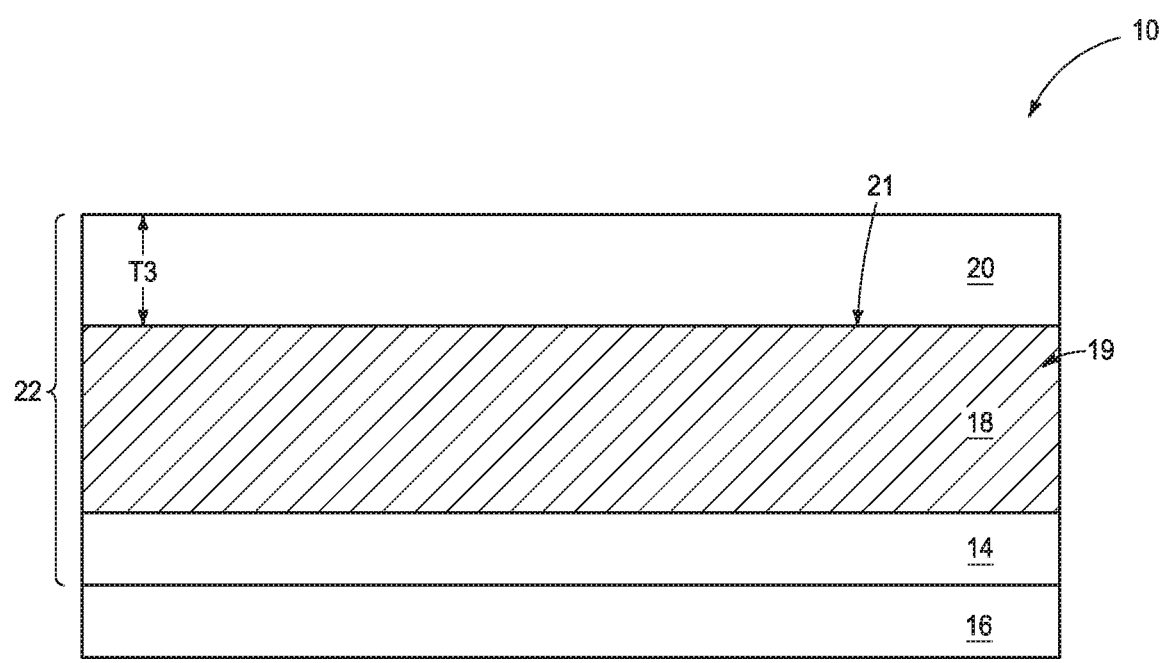

Referring to FIG. 3, a capping material 20 is formed over the conductive material 18, and directly against the upper surface 21 of the conductive material. The capping material 20 may comprise any suitable composition(s); and in some embodiments may comprise one or more of nitrogen, oxygen, carbon and silicon. The capping material 20 may be electrically conductive in some embodiments, and may be electrically insulative in other embodiments.

In some embodiments, the capping material 20 may comprise an oxidized surface of the conductive material 18. For instance, in some embodiments it may be found that oxidation of an exposed surface of the conductive material 18 is self-limiting, and accordingly the capping material 20 may be formed by exposing the upper surface 21 of conductive material 18 to appropriate oxidative conditions (e.g., exposure to air, ozone, etc.). In such embodiments, the capping material 20 may comprise, consist essentially of, or consist of an oxide which includes one or more elements from Group 2 of the periodic table. For instance, the capping material 20 may comprise, consist essentially of, or consist of one or more of beryllium oxide, strontium oxide and magnesium oxide.

In some embodiments, the capping material 20 may comprise a composition deposited over the upper surface 21 of the conductive material 18. Such composition may, for example, comprise, consist essentially of, or consist of one or more of silicon carbide, silicon nitride, SiCN, SiON, etc. (where the chemical formulas indicate primary components, rather than indicating specific stoichiometries). The capping material 20 may be deposited in situ relative to the conductive material 18, and such may be preferred if the conductive material 18 is problematically affected by oxidation. The capping material may be formed with any suitable process, including, for example, a PVD process, a chemical vapor deposition (CVD) process, an atomic layer deposition (ALD) process, etc.

In some embodiments, the capping material 20 may comprise an oxidized surface of the conductive material 18, and may comprise another composition (e.g., one or more of silicon carbide, silicon nitride, SiCN, SiON, etc.) deposited over such oxidized surface.

The capping material 20 has a thickness T3 which may be within a range of from about 50 Å to about 200 Å.

The materials 14, 18 and 20 together form a stack 22.

In some embodiments, the stack 22 may be thermally treated with a temperature of less than or equal to about 60% of the melting temperature of the conductive material 18 to thermally anneal such conductive material and enhance conductivity of the conductive material. Such thermal treatment may be additionally, or alternately, utilized for thermally conditioning other materials and compositions associated with the semiconductor substrate 16 (e.g., for annealing doped regions which may be associated with electrical components (not shown) which are incorporated into the semiconductor substrate 16).

Figure 4:
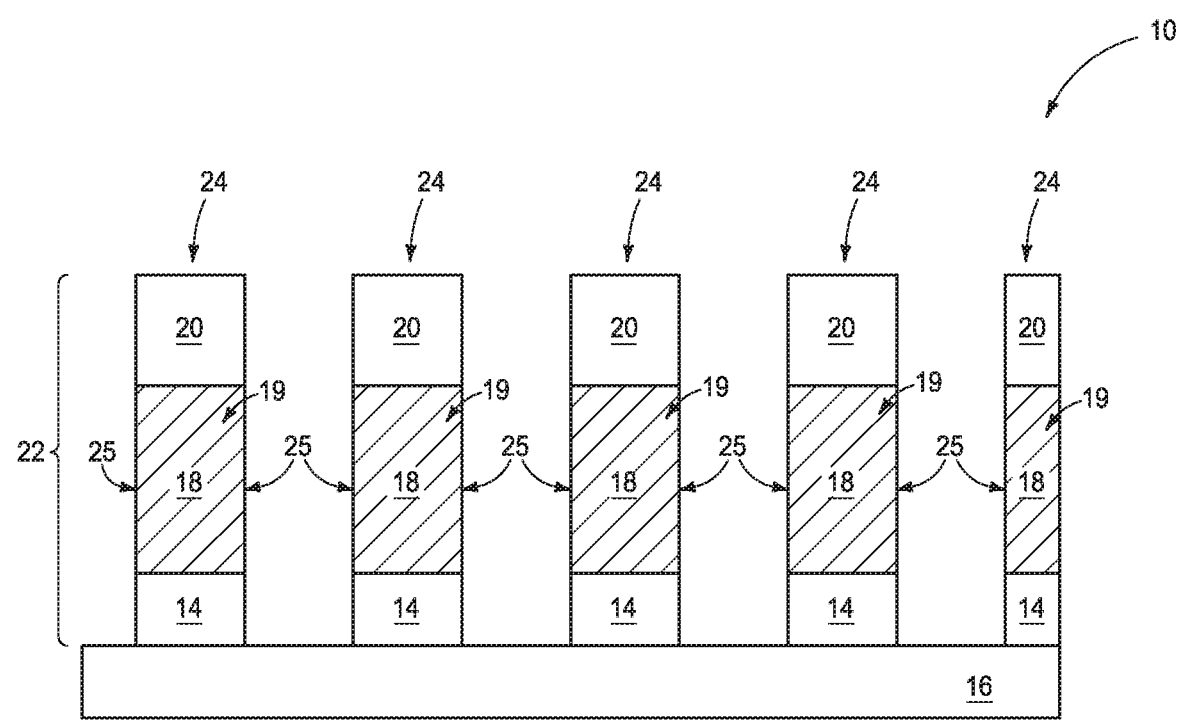

Referring to FIG. 4, the stack 22 is patterned into a plurality of spaced-apart features 24. Such features may correspond to any suitable integrated structures. For instance, the conductive regions 19 of the features 24 may be incorporated into wiring, shielding, wordlines and/or digit lines which extend in and out of the page relative to the cross-section of FIG. 4.

The stack 22 may be patterned with any suitable processing. For instance, a patterned mask (not shown) may be provided over the stack 22, and a pattern may be transferred from such mask through the materials 20, 18 and 14 utilizing one or more suitable etches.

The conductive regions 19 of the features 24 have exposed sidewall surfaces 25.

Figure 5:
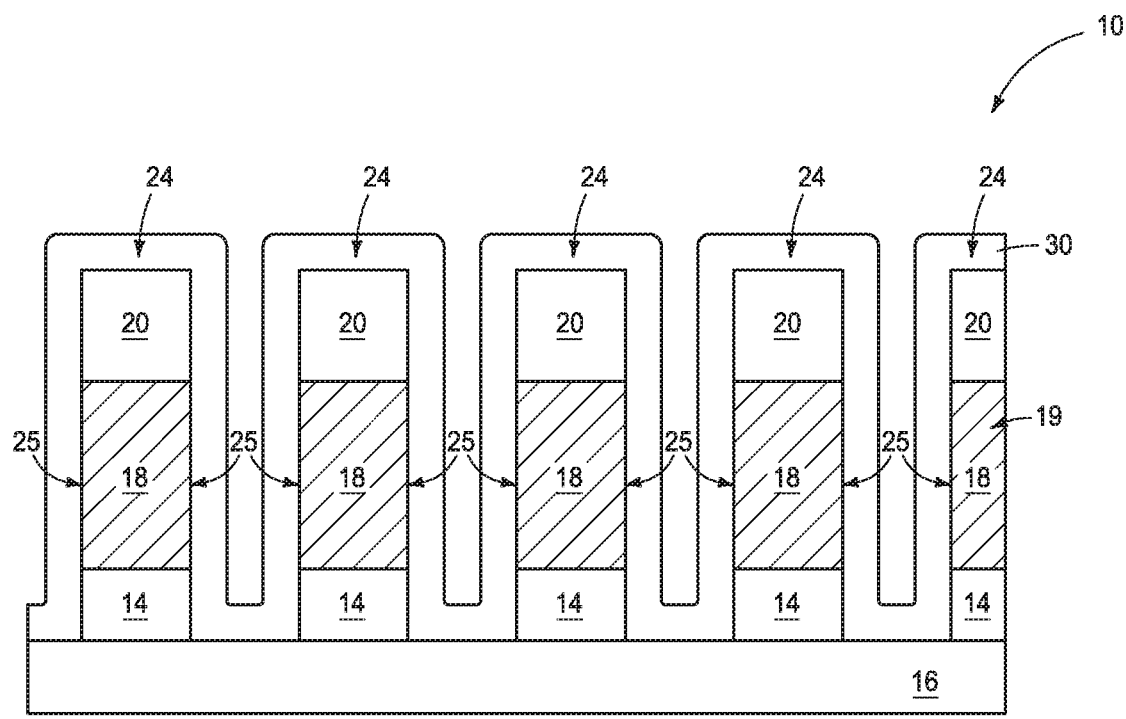

Referring to FIG. 5, protective material 30 is formed over and between the features 24, with the protective material 30 being along and directly against the sidewalk 25 of the conductive features 19.

The protective material 30 may comprise any suitable composition(s). In some embodiments, the protective material 30 may comprise a same composition as the capping material 20, and in some embodiments the protective material 30 may comprise a different composition relative to the capping 20. Regardless, in some example embodiments the protective material 30 may comprise one or more of the compositions described above relative to the capping material 20. For instance, the protective material 30 may comprise silicon nitride, silicon oxynitride, an oxidized surface of material 18, etc.

In some embodiments, the protective material 30 may be formed in situ after patterning the features 24 and prior to exposure of the sidewalls 25 to air or other oxidant. In some embodiments, at least portions of the protective material 30 may be formed by oxidizing regions of the sidewalls 25.

Figure 6:
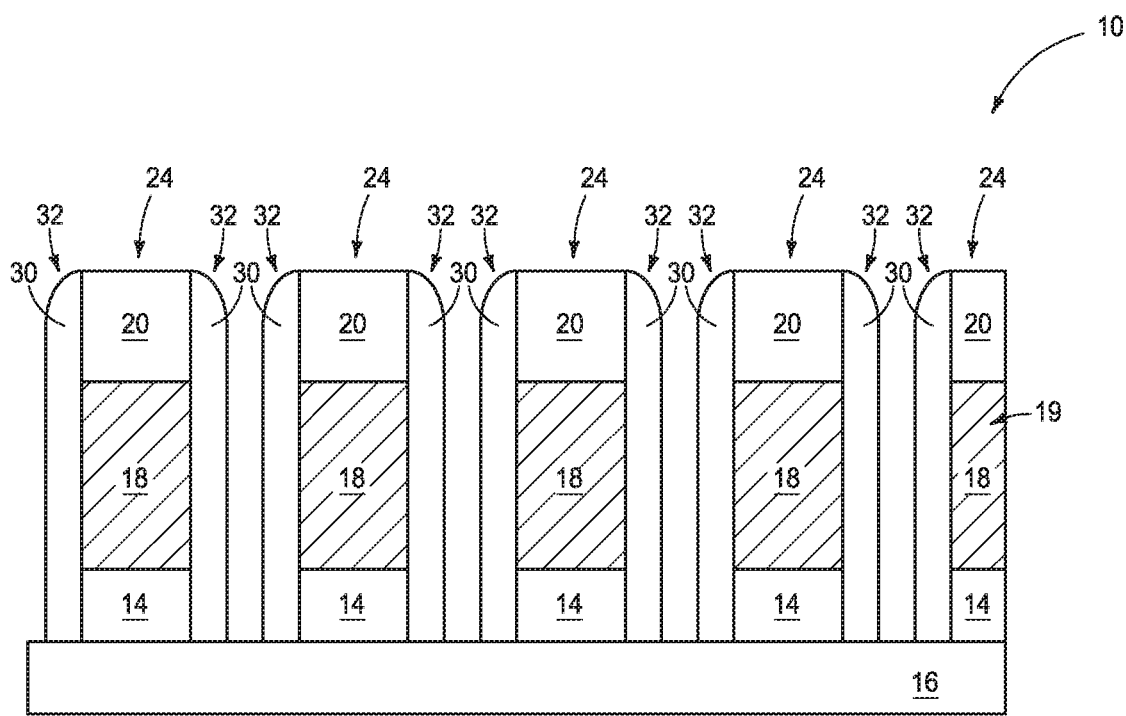

Referring to FIG. 6, the protective material 30 may be subjected to anisotropic etching to form sidewall spacers 32. The processing of FIG. 6 may be optional in embodiments in which the protective material 30 is insulative.

In some embodiments, the capping material 20 and protective material 30 of the construction 10 of FIG. 6 may comprise a same composition as one another; and may, for example, comprise, consist essentially of, or consist of silicon nitride. The base material 14 may comprise the same composition as materials 20 and 30 (for instance may comprise silicon nitride), or may comprise a different material relative to the materials 20 and 30. For instance, in some embodiments the base material 14 may comprise a conductive material (for instance, titanium nitride), while the materials 20 and 30 comprise insulative material (for instance, silicon nitride).

Figure 7:
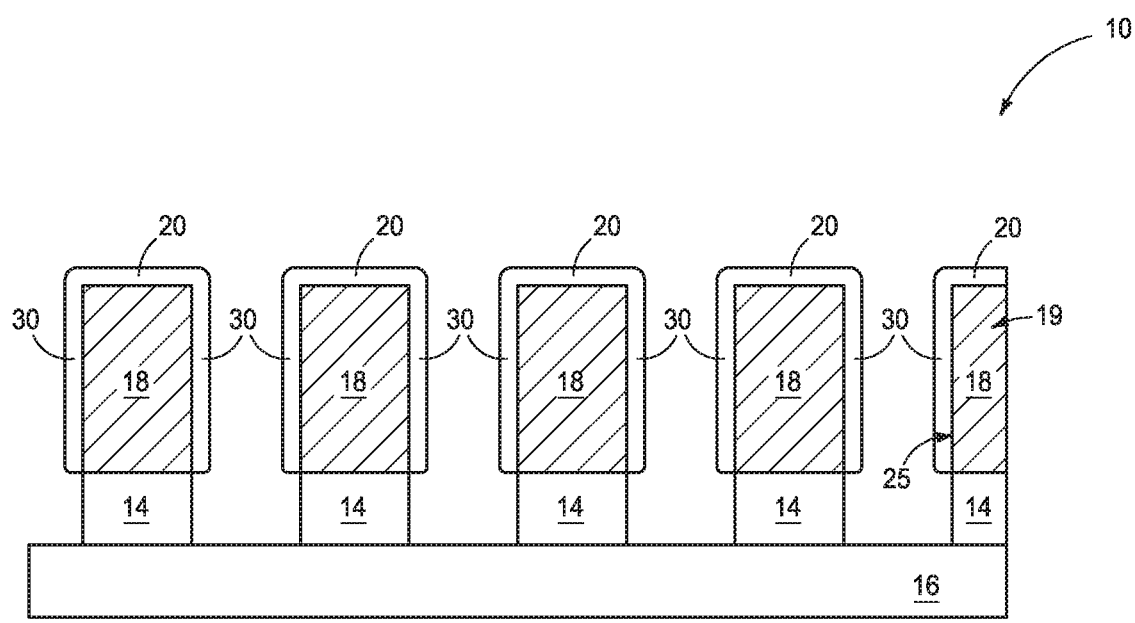
FIG. 7 is a diagrammatic cross-sectional view of a portion of the example construction of FIG. 2 is shown at an example process stage following that of FIG. 2, and alternative to the process stage of FIG. 6.

As indicated above, in some embodiments at least a portion of the protective material 30 may be formed by oxidation of the conductive material 18 along the sidewall surfaces 25. FIG. 7 shows construction 10 at an example process stage which may occur after oxidation of the sidewall surfaces 25 to form the conductive material 30. The construction of FIG. 7 also has upper surfaces 21 of the conductive regions 19 oxidized to form the capping material 20, and in the shown embodiment the capping material 20 and protective material 30 comprise a same composition as one another and merge together to form a shell (in some embodiments an insulative shell) surrounding the top surfaces 21 and sidewall surfaces 25 of the conductive regions 19.

In some embodiments, the conductive material 18 of conductive regions 19 may include beryllium; and the materials 20 and 30 may comprise, consist essentially of, or consist of beryllium oxide.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Some embodiments include an integrated structure having a conductive region which includes one or more elements from Group 2 of the periodic table.

Some embodiments include an integrated structure having a stack which includes a conductive region over and directly against a base material, and which includes a capping material over and directly against the conductive region. The conductive region includes one or more elements from Group 2 of the periodic table. The base material includes one or more of nitrogen, carbon and silicon. The capping material includes one or more of nitrogen, oxygen, carbon and silicon.

Some embodiments include an integrated structure which has a conductive region over and directly against a base material. The conductive region includes one or more elements from Group 2 of the periodic table, and has a pair of opposing sidewalls along a cross-section. A capping material is over and directly against the conductive region. Protective material is along and directly against the sidewalls of the protective region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure comprising a conductive region which includes one or more elements from Group 2 of the periodic table; wherein the conductive region is over and directly against an adhesion material comprising one or more of nitrogen, carbon and silicon; and wherein the adhesion material consists essentially of silicon nitride, wherein an upper surface of the conductive region is directly against a capping material comprising one or more of nitrogen, oxygen, carbon and silicon.

2. The integrated structure of claim 1 wherein the capping material is conductive.

3. The integrated structure of claim 1 wherein the capping material is insulative.

4. The integrated structure of claim 1 wherein the capping material includes an oxide of at least one of said one or more elements from Group 2 of the periodic table.

5. The integrated structure of claim 4 wherein the capping material includes at least one of beryllium oxide, strontium oxide and magnesium oxide.

6. The integrated structure of claim 4 wherein the capping material includes beryllium oxide.

7. An integrated structure comprising a stack which includes a conductive region having a bottom surface, an entirety of the bottom surface being over and directly against an insulative base material, and which includes a capping material over and directly against the conductive region; the conductive region including one or more elements from Group 2 of the periodic table; the base material comprising one or more of nitrogen, carbon and silicon; and the capping material comprising oxygen and the one or more elements from Group 2 of the periodic table, and wherein the base material is insulative.

8. The integrated structure of claim 7 wherein said one or more elements from Group 2 of the periodic table include one or more of beryllium, magnesium and strontium.

9. The integrated structure of claim 7 wherein the conductive region consists of beryllium.

10. The integrated structure of claim 7 wherein the base material consists essentially of silicon nitride.

11. The integrated structure of claim 7 wherein the capping material is conductive.

12. An integrated structure comprising a stack which includes a conductive region having a bottom surface, an entirety of the bottom surface being over and directly against an insulative base material, and which includes a capping material over and directly against the conductive region; the conductive region consisting of one or more elements from Group 2 of the periodic table; the base material comprising one or more of nitrogen, carbon and silicon; and the capping material comprising the one or more elements from Group 2 of the periodic table and oxygen; and wherein the capping material is insulative.

13. An integrated structure comprising a stack which includes a conductive region over and directly against a base material, and which includes a capping material over and directly against the conductive region; the conductive region including one or more elements from Group 2 of the periodic table; the base material comprising one or more of nitrogen, carbon and silicon; and the capping material comprising one or more of nitrogen, oxygen, carbon and silicon; and wherein the capping material includes at least one of beryllium oxide, strontium oxide and magnesium oxide.

14. The integrated structure of claim 13 wherein the capping material includes beryllium oxide.

15. An integrated structure comprising:
a base material;
a conductive region over and directly against the base material; the conductive region including one or more elements from Group 2 of the periodic table; the conductive region having a pair of opposing sidewalls along a cross-section;
a capping material over and directly against the conductive region;
a protective material along and directly against the sidewalls of the conductive region; and
wherein the protective material is a same composition as the capping material.

16. An integrated structure comprising:
a base material;
a conductive region over and directly against the base material; the conductive region including one or more elements from Group 2 of the periodic table; the conductive region having a pair of opposing sidewalls along a cross-section;
a capping material over and directly against the conductive region;
a protective material along and directly against the sidewalls of the conductive region; and
wherein the conductive region includes beryllium, and wherein the protective material comprises beryllium oxide.

17. The integrated structure of claim 16 wherein the capping material also comprises beryllium oxide.

18. An integrated structure comprising:
a base material;
a conductive region over and directly against the base material; the conductive region including one or more elements from Group 2 of the periodic table; the conductive region having a pair of opposing sidewalls along a cross-section;
a capping material over and directly against the conductive region;
a protective material along and directly against the sidewalls of the conductive region; and
wherein the base material is conductive; and wherein the capping material and the protective material are insulative.

19. An integrated structure comprising:
a base material;
a conductive region over and directly against the base material; the conductive region including one or more elements from Group 2 of the periodic table; the conductive region having a pair of opposing sidewalls along a cross-section;
a capping material over and directly against the conductive region;
a protective material along and directly against the sidewalls of the conductive region; and
wherein the base material, the capping material and the protective material are all insulative.

20. The integrated structure of claim 19 wherein the base material, the capping material and the protective material are all a same composition as one another.

21. The integrated structure of claim 20 wherein the base material, the capping material and the protective material all comprise silicon nitride.

22. An integrated structure comprising:
a base material;
a conductive region over and directly against the base material; the conductive region including one or more elements from Group 2 of the periodic table; the conductive region having a pair of opposing sidewalls along a cross-section;
a capping material over and directly against the conductive region;
a protective material along and directly against the sidewalls of the conductive region; and
wherein the base material comprises titanium nitride; and wherein the capping material and the protective material both comprise silicon nitride.

* * * * *